United States Patent [19]
Scobey et al.

[11] Patent Number: 6,115,401
[45] Date of Patent: Sep. 5, 2000

[54] EXTERNAL CAVITY SEMICONDUCTOR LASER WITH MONOLITHIC PRISM ASSEMBLY

[75] Inventors: Michael A. Scobey, Marlborough; Xinxiong Zhang, Northborough, both of Mass.

[73] Assignee: Corning OCA Corporation, Corning, N.Y.

[21] Appl. No.: 09/007,586

[22] Filed: Jan. 15, 1998

Related U.S. Application Data

[63] Continuation-in-part of application No. 08/600,848, Feb. 13, 1996, abandoned.

[51] Int. Cl.[7] ....................................................... H01S 3/08
[52] U.S. Cl. ............................... 372/100; 372/19; 372/95
[58] Field of Search .................................. 372/20, 32, 95, 372/99, 100, 102, 19

[56] References Cited

U.S. PATENT DOCUMENTS

| | | | |
|---|---|---|---|
| 4,504,950 | 3/1985 | AuYeung | 372/20 |
| 5,071,206 | 12/1991 | Hood et al. | 359/360 |
| 5,144,632 | 9/1992 | Thonn | 372/33 |
| 5,583,683 | 12/1996 | Scobey | 359/127 |
| 5,608,743 | 3/1997 | Hayakawa | 372/20 |

FOREIGN PATENT DOCUMENTS

| | | |
|---|---|---|
| 0262435A | 4/1988 | European Pat. Off. . |
| 0516263A | 12/1992 | European Pat. Off. . |
| 61-200511A | 5/1986 | Japan . |
| 03209638A | 12/1991 | Japan . |

OTHER PUBLICATIONS

Zorabedian, et al. "Interference–filter–tuned, alignment–stabilized, semiconductor external–cavity laser", Optics Letters vol. 13, No. 10 Oct. 1988, pp. 826–828.

"Tunable Lasers Handbook" (Edited by FJ Duarte)—Tunable External–Cavity Semiconductor Lasers (Chapter 8—written by P Zorabedian), pp. 349–393; 1995 (no month).

"High Stability 1.5M External–Cavity Semiconductor Lasers for Phase–Lock Applications", Kahn et al, IEEE Photonics Technology Letters, vol. 1, No. 7, Jul. 1989, pp 159–161.

"Wavelength tuning of a dye laser using a prism coated with dielectric interference filter", Matsuzawa et al, Electronics & Communications in Japan, Part I—Communications, vol. 61, No. 9, Sep. 1978, pp 81–86.

Primary Examiner—Teresa M. Arroyo
Assistant Examiner—Robert E. Wise
Attorney, Agent, or Firm—William Greener; Juliana Agon

[57] ABSTRACT

An external cavity, single mode laser has a semiconductor gain medium, such as a diode laser, and a monolithic prism assembly positioned in an external resonant cavity having a length of 10 mm or less. The monolithic prism assembly includes a transparent substrate carrying a thin film Fabry-Perot interference filter on a face which is tilted to the path of travel of the laser light in the external cavity. Translation of the monolithic prism assembly including transversely to the optical axis provides continuous mode-hop-free tuning of the laser output wavelength. The Such optical devices can be economically mass produced in advantageously small size, having reproducible spectral performance properties held within tight tolerances. Significantly advantageous applications include dense wavelength division multiplexing systems requiring tightly spaced wavelength subranges for each of multiple channels. High wavelength stability against temperature and humidity changes, etc., can be achieved.

44 Claims, 13 Drawing Sheets

EXTERNAL CAVITY SEMICONDUCTOR LASER WITH MONOLITHIC PRISM ASSEMBLY

This application is a Continuation-In-Part of Ser. No. 08/600,848, filed Feb. 13, 1996, now abandoned.

FIELD OF THE INVENTION

The present invention is directed to optical devices relating to external cavity semiconductor lasers, and in particular to external cavity lasers having stabilized emission wavelengths, single mode output and the provision of continuous mode-hop-free tuning.

BACKGROUND

External cavity semiconductor lasers are known and have numerous uses and applications, including fiber-optic communications. In external cavity diode lasers which are typical of such optical devices, an optical cavity extends between a first facet of a semiconductor diode laser and an external reflector, defining the cavity ends. Another facet of the semiconductor laser, between the reflector and the first facet, typically carries an anti-reflection coating to allow light to escape the laser chip with minimum reflection.

Semiconductor diode lasers have been used extensively as transmitters for fiber-optic communications. In one common and low cost implementation, edges of two opposing end facets of the laser chip are cleaved to form resonant reflective surfaces and provide the feedback necessary for laser operation. Such Fabry-Perot (FP) lasers typically emit in multiple longitudinal modes and have large output bandwidths, for example, 3 nm to 10 nm. In another common implementation with slightly increased complexity, a Bragg grating is etched in the active region of the Fabry-Perot laser cavity to form a distributed feedback laser (DFB). Distributed feedback lasers have the advantage of single longitudinal mode emission which provides very narrow bandwidths typically, for example, less than 0.01 nm. In a third application, the distributed Bragg reflector (DBR) substitutes a wavelength-selective Bragg grating for one of the cleaved facets of the Fabry-Perot laser. The wavelength-selective Bragg grating has the effect of producing a laser with single longitudinal mode output.

Application of these and other diode lasers has been impeded due to inadequate stability and accuracy in the particular wavelengths generated. In particular, for example, such difficulties have been experienced in the application of diode lasers in Dense Wavelength Division Multiplexing (DWDM). In this advanced fiber-optic communication technology, many closely spaced wavelengths or channels are transmitted simultaneously down a single fiber or fiber bundle. Typical spacing of channels in DWDM systems can range from 5 nm to as little as 0.8 nm or less between channels, with closer channel spacing envisaged. To accomplish effective DWDM systems, stable and accurate transmitters of selectively predetermined wavelengths are needed for individual channels. In addition, stable and accurate wavelength-selective receivers are needed to selectively remove or receive the individual channel wavelengths with low or no cross talk from other channels. For a DWDM system to operate efficiently, therefore, the transmitter and receiver device for a given channel must be tuned with great accuracy to the same wavelength band.

Unfortunately, the wavelength band emitted by presently known semiconductor diode lasers, including the above mentioned FP lasers, DFB lasers and DBR lasers, vary to an unacceptably large degree with temperature and other factors. Center wavelength temperature dependence of an FP laser, for example, is typically as much as 0.4 nm per degree centigrade change in operating temperature. The comparable variance for DFB lasers is typically as much as 0.1 nm per degree centigrade. Presently known semiconductor diode lasers also suffer the disadvantage of poor manufacturing repeatability. That is, an intended or specified emission wavelength is not achieved with adequate accuracy when such lasers are produced in large commercial quantities. These deficiencies render present semiconductor diode lasers difficult and costly to implement into demanding applications such as DWDM systems, and in many cases entirely unsuitable.

It is known that the temperature dependence of an individual laser can be mitigated by controlling the temperature of the laser to within an extremely small temperature range using, for example, thermoelectric coolers with closed loop feedback from a temperature sensor. Such controls are complex and costly. The even more difficult problem of controlling lot-to-lot wavelength variation in commercial manufacturing of presently known semiconductor diode lasers, which can be as great as ±10 nm, has been partially addressed by culling through production batches for lasers having the desired wavelength. This technique of wavelength testing of individual lasers has significant adverse impact on manufacturing yield, with correspondingly increased costs and complexity.

It has also been proposed to use an alternative type of semiconductor diode laser, specifically, tunable external cavity lasers (ECL's). Tunable ECL's are suggested, for example, in *Widely Tunable External Cavity Diode Lasers*, Day et al, SPIE, Vol. 2378, P. 35–41. In the diode laser devices suggested by Day et al, an anti-reflective coating is placed on one facet of a diode laser chip. The emitted light is captured by a collimating lens, and a diffraction grating, acting in part as an external cavity reflector, is used to select or tune the wavelength of the laser. Laser action occurs, generally, provided that the grating is selecting a wavelength within the diode's spectral gain region. A diode laser device employing a diffraction grating disposed in an external cavity also is suggested in U.S. Pat. No. 5,172,390 to Mooradian. Unfortunately, diffraction gratings disposed within the external cavity of a diode laser create a significant increase in the overall size or bulk of the device. The diffraction grating and the complexity of the required grating alignment system can also significantly increase the cost of the device. As to the size or bulk of the device, the cavity length for a diode laser having a diffraction grating disposed in an external resonant cavity, in accordance with known devices, is typically from 25 mm to over 100 mm, in contrast to the much smaller 1 mm size or smaller of FP lasers and DFB lasers discussed above. The diffraction grating and grating mount also have been found to exhibit temperature dependence. Since the diffraction grating sets the wavelength of the laser, such temperature dependence of the grating and grating mount cause unwanted instability in the emitted wavelength of the laser. In addition, long term wavelength drift problems have been experienced due, it is believed, to the mechanical complexity of the diffraction grating and grating mount aspects of such devices.

Another known tunable ECL incorporates a Fabry-Perot thin film interference filter in the external cavity. The filter passband defines the resonant oscillation in the cavity and thus the operating wavelength of the ECL. As reported, e.g. by Zorabedian et al., Interference-filter-tuned, alignment-stabilized, semiconductor external-cavity laser, *Optics*

Letters, Vol. 13, No. 10, pp 826–828 (10/88), wavelength tuning is accomplished by tilting the filter (see FIG. 11 herein). Such tilting, however, results in a change in the optical path distance through the filter assembly which does not correspond to the rate of change of the wavelength so that the tuned wavelength values jump by an amount corresponding to the adjacent mode spacing of the external cavity of the device. This effect is known as mode-hopping. Moreover, single mode filter-based ECL's (FECL's) are not reported, due to the unavailability of sufficiently narrow bandwidth filters and the limiting physical dimensions of ECL components like diode laser chips, filter/substrates, beam shaping optics and cavity reflectors. Thus the physical length of typical FECL's, which in inverse proportion relates to longitudinal cavity mode spacing, and limiting filter technology, have provided for bulky, multimode devices.

It is an object of the present invention to provide external cavity laser devices having good wavelength stability and accuracy, compact size (i.e., shorter cavity length and device volume), single mode output, and additionally, continuous, mode-hop-free tuning. In particular, it is an object to provide such devices having advantageous manufacturing costs and reduced complexity. Additional objects of the invention will be apparent from the following disclosure and from the detailed description of certain preferred embodiments.

SUMMARY

In accordance with a first embodiment, an external cavity laser is provided having a gain medium optically coupled to an external resonant cavity, with a monolithic prism assembly in the external resonant cavity. In accordance with certain preferred aspects, the gain medium is a semiconductor diode laser, e.g., formed of InGaAsP. Other suitable gain media include, e.g., erbium or other rare earth doped silica, germania or other amplifying optical material formed as bulk, planar or fiber waveguides. In certain aspects the semiconductor gain media are direct or indirect bandgap semiconductor optical emitters. The monolithic prism assembly comprises a transparent substrate, that is, a substrate which is substantially optically transparent to the laser light, having a first external face and a second face opposed to the first face and inclined at an acute angle, $\alpha$, to the first face and to a transverse plane of the external cavity. One face of the substrate, preferably the inclined face, incorporates a thin film Fabry-Perot interference filter. The substrate and thus the Fabry-Perot interference filter is disposed in the path of travel of the laser light in the external cavity. In an aspect of the invention, the filter, oriented at the angle, $\alpha$, to a transverse plane, is carried on either an internal or external surface, as discussed below, which is disposed at a non-zero angle to a transverse plane primarily to deflect out of band light away from the optical axis to prevent unwanted feedback into the gain medium. As used here, a "transverse plane" is an imaginary plane normal or orthogonal to the path of laser light (i.e., the optical axis of the cavity outside of the prism assembly) in the external cavity. Correspondingly, a transverse surface of the transparent substrate is one which lies in (or approximately in) a transverse plane or normal to the optical axis. The angle, $\alpha$, typically is less than 45° and more than 0°, preferably less than 5°, and more preferably less than 1° to a transverse plane.

The thin film Fabry-Perot interference filter, in accordance with embodiments of the invention, is a stable, narrowband interference filter provided as a coating on a surface of the transparent optical substrate of the monolithic prism assembly. While the interference filter preferably has a single cavity comprising at least one thin film spacer layer sandwiched between multiple thin film reflector layers, more preferably it is a multi-cavity filter of two to five cavities, most preferably having two or three cavities. The wavelength referred to is typically about the center of the wavelength band of laser light to be transmitted through the filter. The use of a multiple cavity Fabry-Perot interference filter in the monolithic prism assembly yields a filter transmission profile with increased slope of the spectral skirts, along with a wider transmission zone, as compared to a single cavity filter. Both of these effects provide improved performance of the external cavity lasers disclosed here in comparison with prior known filtering devices, such as etalons and diffraction gratings, as discussed further below.

It will be further understood from the discussion below that the monolithic prism assembly is not intended to provide any light dispersion function in the classic sense of a prism. Rather, it provides a stable, compact support structure for integrally disposing a thin film filter and a coating such as a cavity reflector, A/R coating, or output coupler, for example, in the external cavity. Additionally, it provides the disposition of the filter at an angle to the optical axis for deflecting filter out-of-band light away from the optical axis to prevent unwanted feedback into the gain medium. Light from the optical emitter is acted upon by the filter, such that in-band light is transmitted and out-of-band light is reflected away. The monolithic prism assembly could also be referred to as a filter monolith. Optical devices in accordance with this aspect advantageously comprise a semiconductor diode laser having an anti-reflection coating on an intracavity (inward cavity-facing) emitter facet, optically coupled to the external resonant cavity. An output coupler reflective coating is provided on an outwardly facing emitter facet of the diode laser (i.e., one cavity end). The monolithic prism assembly is positioned in the external resonant cavity, and comprises a transparent optical substrate carrying a reflective coating on an external surface thereof to define the other end of the external resonant cavity. A thin film Fabry-Perot interference filter is provided on a second surface of the optical substrate inclined at an angle, $\alpha$, positioned within the external resonant cavity between the reflective coating and the first emitter facet. A collimating means, such as a gradient index lens or bulk lenses, etc., also is positioned in the external resonant cavity, e.g., for focusing light between the Fabry-Perot interference filter and the first emitter facet of the diode laser. Isolators and/or other optical elements such as a collimator, for example, can be used outside the cavity for appropriate coupling to an optical system.

In another embodiment of the invention which provides for continuous mode-hop-free tuning of the laser operating wavelength, $\lambda$, the monolithic prism assembly comprises a transparent substrate having two opposing external faces. One of the faces incorporates a variable, thin film F-P interference filter, preferably a linearly variable filter, and more preferably a continuously linearly variable filter, such as that disclosed, e.g., in U.S. Pat. No. , 5,583,689, the teachings of which are hereby incorporated by reference in their entirety. One substrate face which preferably incorporates the filter is inclined at a slight angle, $\alpha$, with respect to the other substrate face, to deflect filter out-of-band light away from the optical axis of the cavity lying outside of the prism assembly. In an aspect of this embodiment, the peak transmission wavelength of the filter increases linearly from the thinner to the thicker side of the substrate. Wavelength tuning is achieved by translating the monolithic prism assembly in the X-Y plane (either along the X or Y-axis corresponding to the prism thickness variation direction). The rate of change in the peak wavelength of the translated filter corresponds to the rate of change of the optical path length (index, n, multiplied by physical thickness, $L_{substrate}$) in the substrate such that the value of M in the equation $$M=2L/\lambda \tag{1}$$

stays constant as λ changes, where M is an integer, L is the total optical length of the external laser cavity, and is the operational wavelength.

In another embodiment of the invention which provides an external cavity laser with mode-hop-free tuning, the monolithic prism assembly includes a transparent substrate with parallel opposing faces, one of which incorporates a linear variable filter as described above, in which the substrate has a gradient index of refraction in the X-Y plane (in the X or Y direction corresponding to the variable index direction). The index of refraction of the substrate changes linearly in the X or Y-direction, as the case may be, as the monolithic prism assembly is translated in the X-Y plane, to change the peak transmission wavelength at a rate such that the value of M in equation (1) remains constant as λ changes.

In alternative aspects of the foregoing embodiments, the face of the substrate of the prism assembly not incorporating the filter can be antireflection coated and be optically adjacent to the cavity end reflector, or this same face of the substrate can incorporate a cavity end reflective coating, thus eliminating the need for a separate cavity end reflecting element, and decreasing the physical size (cavity length, device volume) of the ECL device.

In an aspect of all of the foregoing embodiments, the device is athermalized by selecting component materials with certain material properties such that the total optical length of the device remains constant independent of environmental changes that affect the optical lengths of the components of the device. Athermalizing the device thus provides mode-hop-free, wavelength stable laser operation without active temperature control, as might typically be provided by a thermoelectric cooler.

Those who are skilled in the art, or knowledgeable in this area of technology, will recognize that the embodiments of the optical devices disclosed herein are a significant technological advance, especially because they provide short cavity length devices producing single mode operation and continuous mode-hop-free tuning. Moreover, external cavity lasers employing a semiconductor gain medium in accordance with this disclosure can be produced with accurate and reproducible emission wavelengths, excellent temperature stability, and excellent resistance to wavelength drift. It is also highly significant that such ECL's can be produced in large commercial quantities at beneficial costs.

As discussed below, preferred embodiments of the laser devices disclosed herein may be referred to as filter-locked lasers and tunable external cavity filter locked lasers, because they stabilize or lock the emission wavelength of the device. Preferred embodiments of the ECL's disclosed herein, and optical devices incorporating them, can be reproducibly manufactured in commercial quantities with emission wavelength held to ≦0.01 nm, and with high temperature independent stability. Long term wavelength drift can be held to less than ±0.1 nm. Moreover, the monolithic prism assembly incorporating the thin film Fabry-Perot interference filter enables overall cavity length of the diode laser to ≦10 mm and as small as 5 mm or less in certain preferred embodiments. Those skilled in the art will recognize that these packaging and performance characteristics render preferred embodiments of the lasers disclosed here, and optical devices incorporating them, suitable and commercially practical for applications such as, most notably, dense wavelength division multiplexing fiber-optic communication systems. As discussed above, previously known diode lasers, such as those incorporating diffraction gratings, etalons, interference filters, or the like for wavelength control, were too complex, bulky, unreliable, and costly to satisfy the exacting requirements of such applications, and are generally multiwavelength devices incapable of providing mode-hop-free tuning.

Additional aspects and advantages of the present invention will become apparent or more readily understood from the following detailed description of certain preferred embodiments.

BRIEF DESCRIPTION OF THE DRAWINGS

Certain preferred embodiments of the invention are discussed below with reference to the accompanying drawings in which.

Figure 1:
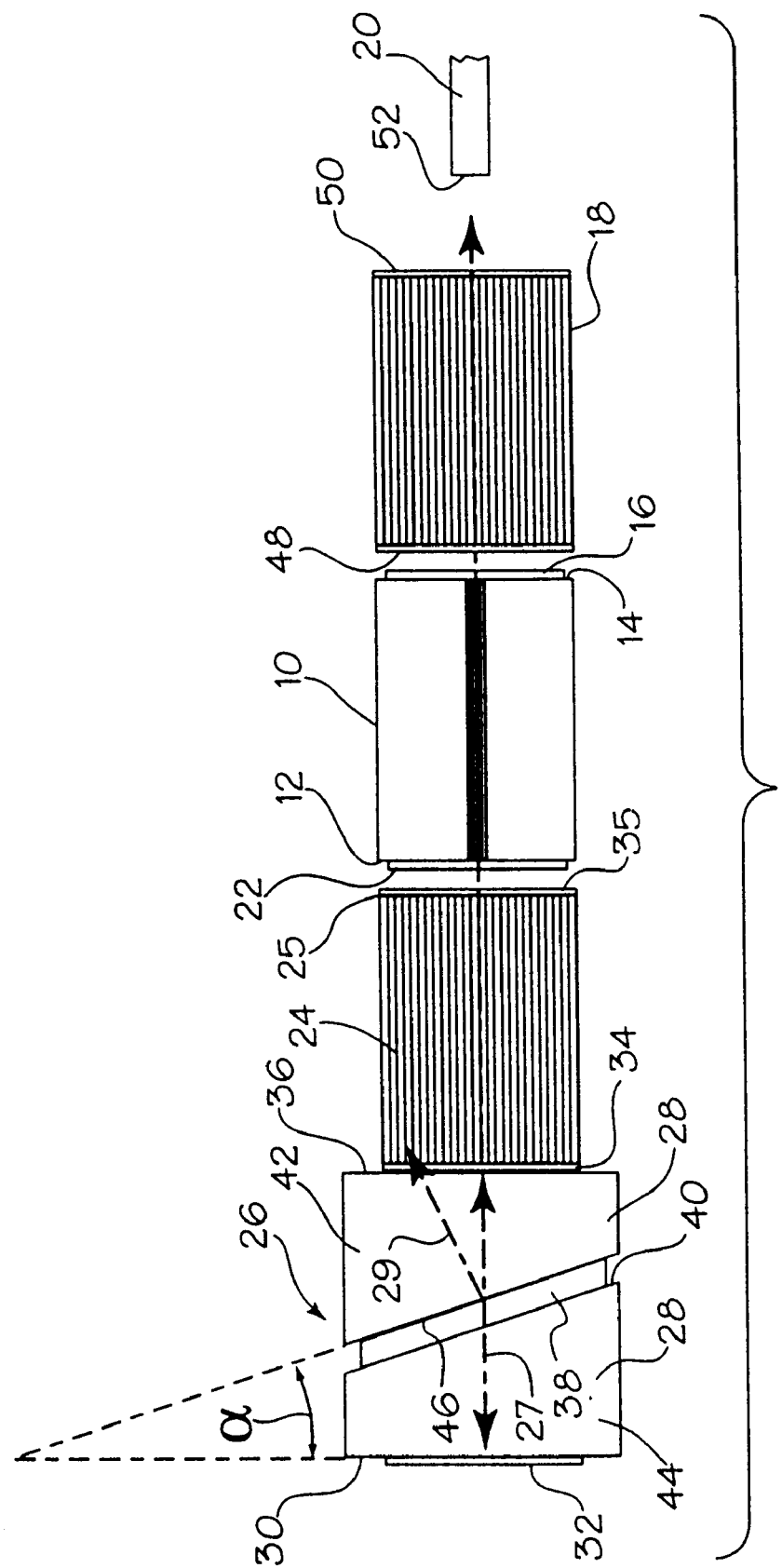
FIG. 1 is a schematic illustration of a first preferred embodiment of an optical device incorporating an external cavity laser in accordance with the foregoing disclosure.

It should be understood that the optical devices illustrated in the drawings are not necessarily to scale, either in their various dimensions or angular relationships. It will be well within the ability of those skilled in the art, with the aid of the foregoing disclosure and the following detailed description of preferred embodiments, to select suitable dimensions and angular relationships for such devices intended for a particular application.

DETAILED DESCRIPTION OF CERTAIN PREFERRED EMBODIMENTS

Those who are skilled in this area of technology will recognize from the above discussion that the external cavity lasers disclosed here have numerous applications, including use in fiber-optic telecommunications systems, especially in systems employing dense wavelength division multiplexing wherein extremely narrow and precisely controlled transmission wavelengths are required. Additional applications include, for example, use in test equipment and the like, as well as laboratory instrumentation.

In contrast to previously known laser devices, such as FP lasers, DFB lasers and DBR lasers, in the devices disclosed herein utilize a thin film Fabry-Perot interference filter incorporated on a transparent substrate that is used in an external laser cavity to lock the emission wavelength or band of the external cavity laser within a narrow spectral region. The laser is limited to single mode operation by employing a suitable thin film Fabry-Perot narrowband interference filter in a short ($\leq 10$ mm) external cavity. Thus, the lasers disclosed and discussed here can be said to be filter-locked, single mode ECL's, and in certain embodiments, continuously tunable, filter-locked, single mode ECL's. "FL lasers" as they will be referred to in some instances below, have especially advantageous application in DWDM fiber optic telecommunication systems. Precise and stable wavelength laser emitters are called for in such applications, so that closely spaced transmission channels are reliably separate and distinct. Those skilled in the art will recognize that there are various other applications for the FL lasers disclosed here, especially applications calling for a selective wavelength, stable and accurate narrowband laser source.

In the FL laser schematically illustrated in FIG. 1, an external cavity diode laser assembly 1 is seen to include a laser diode chip 10 having a first emitter facet 12 and a second, opposite emitter facet 14. Emitter facet 14 carries a coating, specifically, an output coupler reflective coating 16. Light emitted from device 1 through coating 16 is received by collimating lens 18 which preferably is a gradient index lens (GRIN) or the like and which preferably incorporates A/R coatings 48, 50 on its external surfaces. Collimated light from gradient index lens 18 is passed to fiber-optic pigtail 20 the end of which incorporates A/R coating 52, whereby it enters a fiber-optic communication system (not shown). GRIN lens 18 could optionally be deleted in favor of a butt coupling between emitter facet 14 (now carrying an anti-reflective coating 16) and pigtail 20. Additionally, an isolator (not shown) can be employed outside the cavity following a gradient index lens or other collimating lens, passing light to pigtail 20. Isolators are generally well known and their use and the use of other optional components in the FL lasers disclosed here will be apparent to those skilled in the art in view of the present disclosure and with reference to FIG. 2, below. Emitter facet 12 carries coating 22, preferably an anti-reflective coating. Light passing through anti-reflective coating 22 is received and collimated by a second collimating element 24 which, again, preferably is a gradient index lens or the like having A/R coatings such as 35 on surface 25 thereof. Light is passed from collimating element 24 into a monolithic prism assembly 26 comprising a transparent optical substrate 28. Substrate 28 preferably is optical glass, such as BK7 or B270, both available from Schott Glaswerke (Mainz, Germany), or the like. External face 30 of substrate 28 carries end reflector coating 32, such that the external cavity of the FL laser is defined between output coupler mirror 16 and end reflector coating 32. Preferably, anti-reflective coating 34 is carried on external face 36 of substrate 28 to facilitate passing of collimated light from lens 24 into the monolithic prism assembly 26.

The prism assembly further comprises thin film Fabry-Perot interference filter 38 incorporated on (internal) face 40 of substrate 28. "Internal face" as that term is used here most typically is a surface-to-surface contact interface between two parts or pieces of the transparent substrate which have been cemented or otherwise integrated to each other to form the monolithic prism assembly. An optical coating on an internal surface, for example the Fabry-Perot interference filter 38, is advantageously protected and stabilized by the bonded pieces of the substrate between which it is sandwiched. In that regard, it should be recognized that the gap shown between first piece 42 of substrate 28 and second piece 44 is highly exaggerated in FIG. 1 for purposes of illustration. It should also be recognized that Fabry-Perot interference filter 38 could be formed on internal face 46 of part 42, as well as on internal face 40 of part 44. An external face of the substrate, correspondingly, is a surface of the substrate which does not form a surface-to-surface contact interface with another part or portion of the substrate. It may, therefore, be exposed to atmosphere or in physical or optical abutment with another optical element, such as a collimating element, mounting structure or the like. An external face may be coated, as in the case of the substrate in the embodiment of FIG. 1 wherein external face 30 carries end reflector coating 32 and external face 36 carries anti-reflection coating 34. A round hole or other aperture (not shown) can be placed in or on surface 36 or other suitable location to limit beam angles impinging on the filter. Optionally, part 42 of the transparent substrate 28 of the monolithic prism assembly could be deleted in favor of, e.g., an air gap. Since air has a lower index of refraction than glass, this would yield an advantage in a reduced optical length of the external cavity. It should be recognized that components of the optical device illustrated in FIG. 1 may be spaced from or in abutment with adjacent elements as required by the performance and packaging specifications of a given application, and the components may be slightly tilted to further reduce unwanted back reflections.

In FIG. 1, end reflector 32 on outwardly facing external face 30 of substrate 28 lies in a transverse plane, that is, in a plane which is substantially normal to the optical axis of the external cavity. The Fabry-Perot interference filter 38 is inclined at an acute angle, $\alpha$, to a transverse plane. The angle $\alpha$ between the interference filter 38 and a transverse plane at their imaginary intersection point (upward in the plane of the paper as viewed in FIGS. 1 and 7) is larger than zero degrees and preferably less than 45°; more preferably, $\alpha$ is <1°; and typically is about 0.1°. More generally, the interference filter is positioned at a small angle to deflect filter out-of-band light away from the optical axis to prevent unwanted feedback into the gain medium.

In operation, light emitted from the anti-reflection coated facet 12 of laser chip 10 is transmitted through the filter with low loss along a path represented by arrow 27 and is retro-reflected back toward facet 12 of laser chip 10. Advantageously, reflector coating 32 and Fabry-Perot interference filter 38, can be integrated on the monolithic prism assembly 26 which can be manufactured with a dimension between coating 34 and coating 32 as small as 2 mm or less.

The optical device illustrated in FIG. 1 can be packaged sufficiently compactly, therefore, in contrast to prior known ECL devices, to meet stringent size constraints or limitations of various commercial applications, including certain fiber-optic communications applications such as DWDM applications.

The overall optical length, L, of the external cavity of the laser is defined as $$L = L_0 + (n_1 - 1)L_1 + (n_2 - 1)L_2 + (n_3 - 1)L_3,$$

where $L_0$ is the physical length of the cavity and $n_i$ and $L_i$ (I=1–3) are the refractive index and physical length of light travel, respectively, in the laser diode 10, lens element 24 and monolithic prism assemble 26, respectively. The optical length of the laser cavity defines the wavelength spacing of the longitudinal modes that the laser can support, according to equation (2) below. To provide single mode output, the 3 dB (or Full Width at Half Maximum, "FWHM") bandwidth of the Fabry-Perot interference filter of the monolithic prism assembly is preferably made narrower than twice the adjacent mode spacing. The transmission profile thus prevents oscillation of modes other than the longitudinal mode substantially centered under the peak of the filter transmission profile. In those embodiments in which the Fabry-Perot interference filter FWHM bandwidth is wider than twice the mode spacing, single mode operation of the ECL can be obtained as long as the loss difference of the filter is sufficient to suppress oscillation of the center-adjacent mode. This is accomplished by tailoring the shape of the transmission profile of the filter which those skilled in the art can do by various known techniques, a discussion of which is outside the scope of the invention. The spectral mode spacing, referred to as delta Lambda ($\Delta\lambda$), can be calculated in accordance with the formula:

$$\Delta\lambda = \lambda^2 / 2L \qquad (2)$$

In an exemplary embodiment in accordance with FIG. 1, the components have the size and optical properties shown in Table 1 below:

TABLE 1

| Component | Physical Length | Av. N. | L (mm) |
|---|---|---|---|
| Laser Chip | 0.5 mm | 3.6 | 1.8 |
| GRIN Lens | 1.0 mm | 1.5 | 1.5 |
| Focus distance | 0.2 mm | 1.0 | 0.2 |
| Prism Ass'y. | 2.0 mm | 1.5 | 3.0 |
| Total | 3.7 mm | | 6.5 mm |

Using the formula given above and the numerical component values in Table 1 at $\lambda$1550 nm, where "Av N." is the average index of refraction of the listed components, $\Delta\lambda$ will be approximately 0.18 nm for a cavity length of 3.7 mm. For single mode operation, the Fabry-Perot interference filter of the monolithic prism assembly will preferably have a 3 dB bandwidth less than twice such value, that is, less than 0.34 nm. Employing a multi-cavity Fabry-Perot interference filter, specifically, a two-cavity filter centered at 1550 nm with a 3 dB bandwidth of 0.25 nm, in accordance with preferred embodiments discussed further below, a spectral mode at 1550 nm is transmitted while other modes are rejected. In particular, in each pass through the filter the nearest spectral modes at 1550.17 nm and 1548.83 nm will be rejected by approximately 8 dB. Thus rejection of the adjacent spectral modes can be achieved, while. spectral modes farther from the 1550 nm transmittance mode are rejected in even greater degree.

Figure 6:
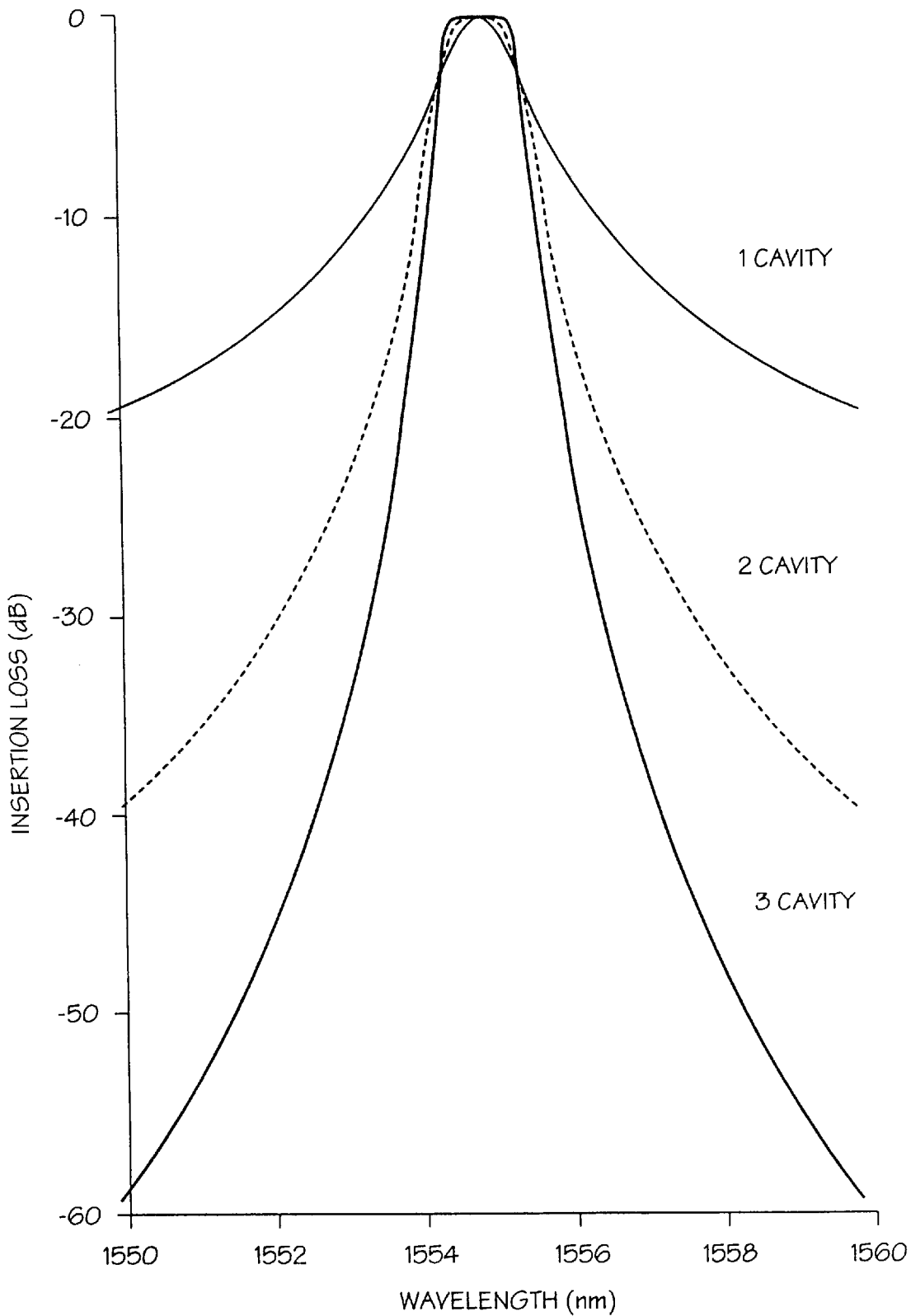
FIG. 6 is a graph showing the theoretical performance of a high quality three-cavity Fabry-Perot interference filter in accordance with FIGS. 3–5, along with the corresponding performance of comparable one and two-cavity thin film Fabry-Perot interference filters.

In this regard, the effect of using multiple-cavity interference filters is illustrated in the graph of FIG. 6. It can be seen in FIG. 6 that the transmittance properties at 1550 nm are excellent for one-cavity, two-cavity and three-cavity filters. The spectral skirts of the two-cavity and three-cavity filters have increasingly greater slope, along with a wider transmission zone, as compared to a single cavity filter. That is, out-of-band spectral modes are reflected in greater degree by a two-cavity filter than a one-cavity filter, and the effect is substantially increased for a three-cavity filter over a two-cavity filter. Both of these effects are advantageous to the performance of external cavity lasers in accordance with the preferred embodiments discussed here, providing advantages over prior known filtering devices, such as etalons and diffraction gratings. Thus, the optical performance of an external cavity laser as disclosed here is achieved by controlling the Fabry-Perot interference filter of the monolithic prism assembly. As discussed further below, excellent techniques are available for reproducibly producing Fabry-Perot interference filters with bulk density near unity to prevent water absorption induced filter shifting, etc. This is especially true in those preferred embodiments wherein the Fabry-Perot interference filter is provided on an internal surface of the monolithic prism assembly.

Figure 2:
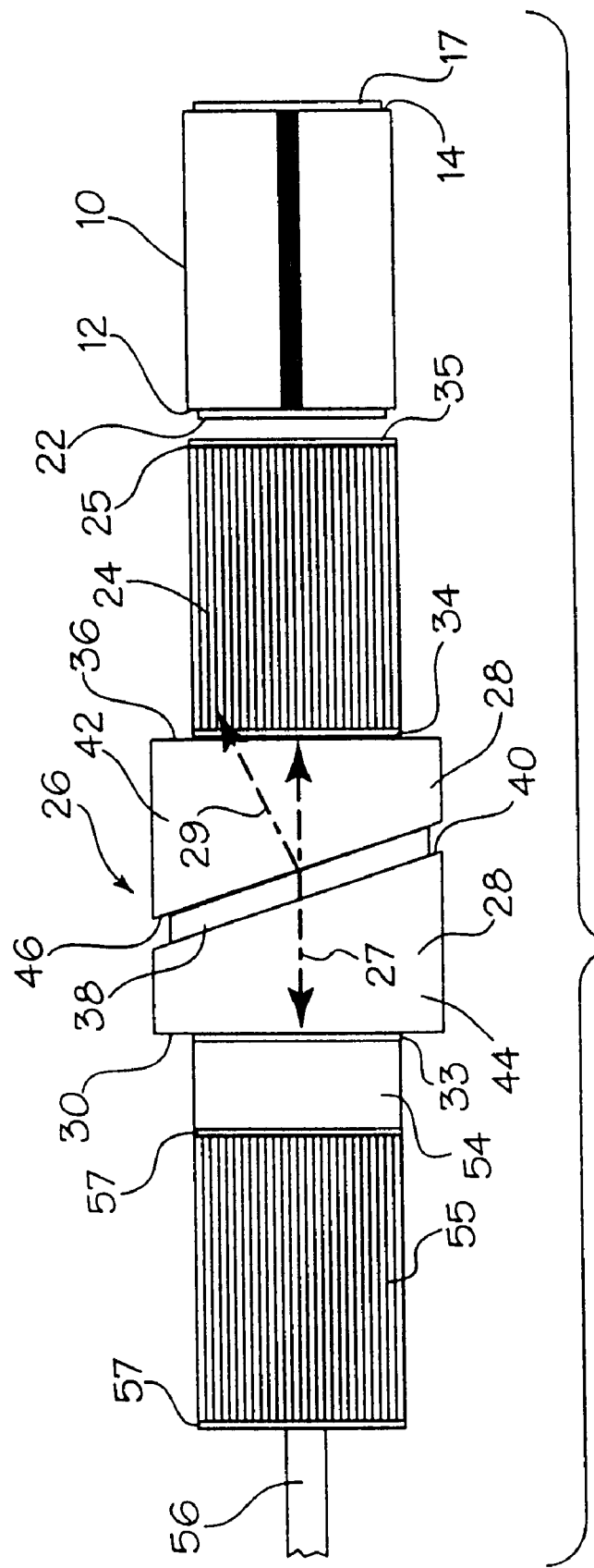
FIG. 2 is a schematic illustration of an external cavity laser in accordance with a second preferred embodiment.

It can be seen that the optical device of FIG. 2 has aspects in common with FIG. 1, and it will be understood to function in correspondingly similar fashion. The reference numbers of FIG. 1 are used for common elements or features in FIG. 2. Output coupler mirror coating 16 of the embodiment of FIG. 1 is replaced by end reflector coating 17 in the embodiment of FIG. 2. End coating 17 defines the right-hand side (as viewed in FIG. 2) of the external resonant cavity. Additionally, end reflector 32 in the embodiment of FIG. 1 is replaced in the embodiment of FIG. 2 with output coupler coating 33. Light is emitted through coating 33 to optical receiver device 56, for example, a fiber optic pig tail, light sensor, etc. More specifically, light emitted through coating 33 passes through optical isolator 54 and then to gradient index lens 55 before reaching pigtail 56. Anti-reflective coatings 57 are provided in accordance with known techniques. In certain applications the embodiment of FIG. 2 advantageously avoids amplifying "noise" as light passes back through the laser diode. Those skilled in the art will recognize that an optical coupler such as coating 33, specifically, a coating in the nature of a beam splitter, could be used in the embodiment of FIG. 1 in place of end reflector 32 to provide a signal to an optical receiver device. The optical receiver device may comprise, for example, a diode sensor for a power feedback loop or simply an output signal carrying optical fiber, etc.

The thin film Fabry-Perot interference filter of the monolithic prism assembly used in the optical devices disclosed here can be produced in accordance with commercially known techniques, whose applicability will be readily apparent in view of the present disclosure. In particular, high-quality interference filters comprising stacked layers of metal oxide materials, such as niobia and silica, can be produced by commercially known plasma deposition techniques, such as ion assisted electron beam evaporation, ion beam sputtering, and reactive magnetron sputtering, for example, as disclosed in U.S. Pat. No. 4,851,095 to Scobey et al. Such coating methods can produce interference cavity filters formed of stacked dielectric optical coatings which are advantageously dense and stable, with low film scatter and low absorption, as well as low sensitivity to temperature changes and ambient humidity. The spectral profile of such coatings is suitable to meet stringent application specifications. In particular, multi-cavity narrow bandpass filters can be produced using such techniques, which are transparent to a wavelength range separated from an adjacent wavelength range (e.g., from the wavelength range of an adjacent channel in a dense wavelength division multiplexing fiber optic system) by as little as two nanometers or less. One suitable deposition technique is low pressure magnetron spattering in which the vacuum chamber of a magnetron sputtering system which can be otherwise conventional, is equipped with high speed vacuum pumping. A gas manifold around the magnetron and target material confines the inert working gas, typically argon, in the vicinity of the magnetron. As the gas diffuses and expands from the area of the magnetron, the unusually high pumping speed vacuum removes the expanding gas from the chamber at a high speed. The inert gas pressure in the chamber, preferably in the range of $5 \times 10^{-5}$ Torr to $1.5 \times 10^{-4}$ Torr, is then a function of the pumping speed of the vacuum pump and the confinement efficiency of the magnetron baffle. Reactive gas enters the chamber through an ion gun which ionizes the gas and directs it toward the substrate. This has the effect of reducing the amount of gas required to provide the film with proper stoichiometry as well as reducing the reactive gas at the magnetron. Throw distance of 16 inch and longer can be achieved.

As noted above, the filter preferably comprises a multi-cavity coating in which two dielectric thin film stacks which by themselves form a reflector for the unwanted wavelengths are separated by a cavity layer. This structure is then repeated one or more times to produce the aforesaid multi-cavity filters with enhanced blocking and improved in-band transmission flatness. The net effect is to produce a narrow-band transmissive filter where in-band light is transmitted and out-of-band light is reflected. In preferred three-cavity embodiments produced by the deposition techniques mentioned above, with dense, stable metal oxide film stacks, excellent thermal stability has been achieved, for example, 0.004 nm per degree centigrade or better at 1550 nanometers, and ultra-narrow band widths separated by as little as 2 nm or even as little as 1 nm.

In accordance with the above mentioned preferred embodiments, the interference filter typically is formed of two materials, the first being a high refractive index material such as niobium pentoxide, titanium dioxide, tantalum pentoxide and/or mixtures thereof, for example, mixtures of niobia and titania, etc. At 1.5 microns wavelength, the refractive index for these materials is roughly 2.1 to 2.3. The low refractive index material is typically silica, having a refractive index of about 1.43. An interference filter has an "optical thickness" which is the numerical product of its physical thickness times its refractive index. The optical thickness of the Fabry-Perot interference filter used in the monolithic prism assembly of the optical devices disclosed here varies, of course, with the physical thickness of the filter and with the refractive index of the material selected. It will be well within the ability of those skilled in the art, in view of this disclosure, to select suitable materials and film thicknesses to achieve spectral transmittance properties suitable to meet the requirements of a given application.

The monolithic prism assembly comprising a thin film Fabry-Perot interference filter in the optical devices disclosed here has significant advantages over prior known devices used for such optical devices. Especially when produced with durable materials to form dense layers of near unity packing density, the interference filter of the monolithic prism assembly is highly stable over time and with respect to humidity and other ambient conditions. Furthermore, a large number of optical substrate blocks can be coated simultaneously with the interference filters in a single coating run, thereby substantially reducing manufacturing costs. They are readily manufactured comprising multiple cavities coherently coupled using quarter wave thickness layers in accordance with known techniques, yielding increased slope of the spectral skirts along with a wider transmission zone. As discussed above, all of these effects, plus the miniature size in which the monolithic prism assembly can be readily fabricated, offer significant advantages over other types of filtering devices, such as etalons and diffraction gratings. Moreover, the stability of the interference filter is enhanced, since it is formed on an optical substrate, especially when carried on an internal surface of the monolithic prism assembly, as discussed above. Such interference filters can be produced in extremely small sizes, for example, less than 0.5 mm thick and only a few millimeters in diameter. As such, they can be readily packaged into tiny, relatively low-cost laser devices. They can be readily manufactured using commercially available techniques, with extremely narrow bandwidths of, for example, 0.3 nm or less. As noted above, transmission of the in-band wavelength range can be extremely high.

Figure 3:
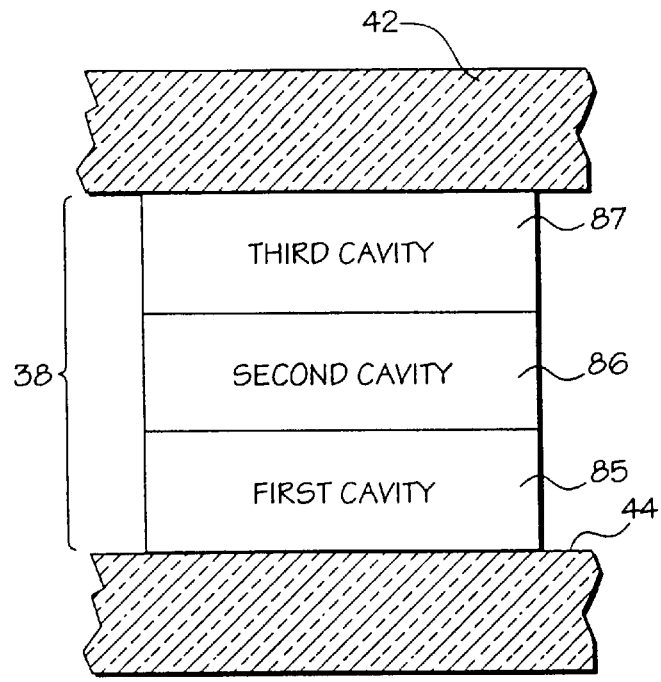
FIGS. 3–5 are schematic illustrations of the thin film Fabry-Perot interference filter of the monolithic prism assembly suitable to be employed in the devices of FIGS. 1 and 2.
Figure 4:
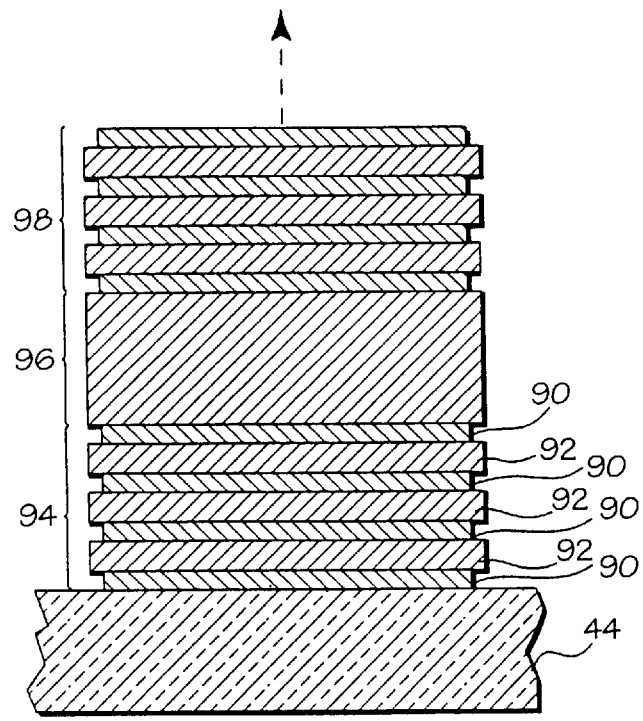
Figure 5:
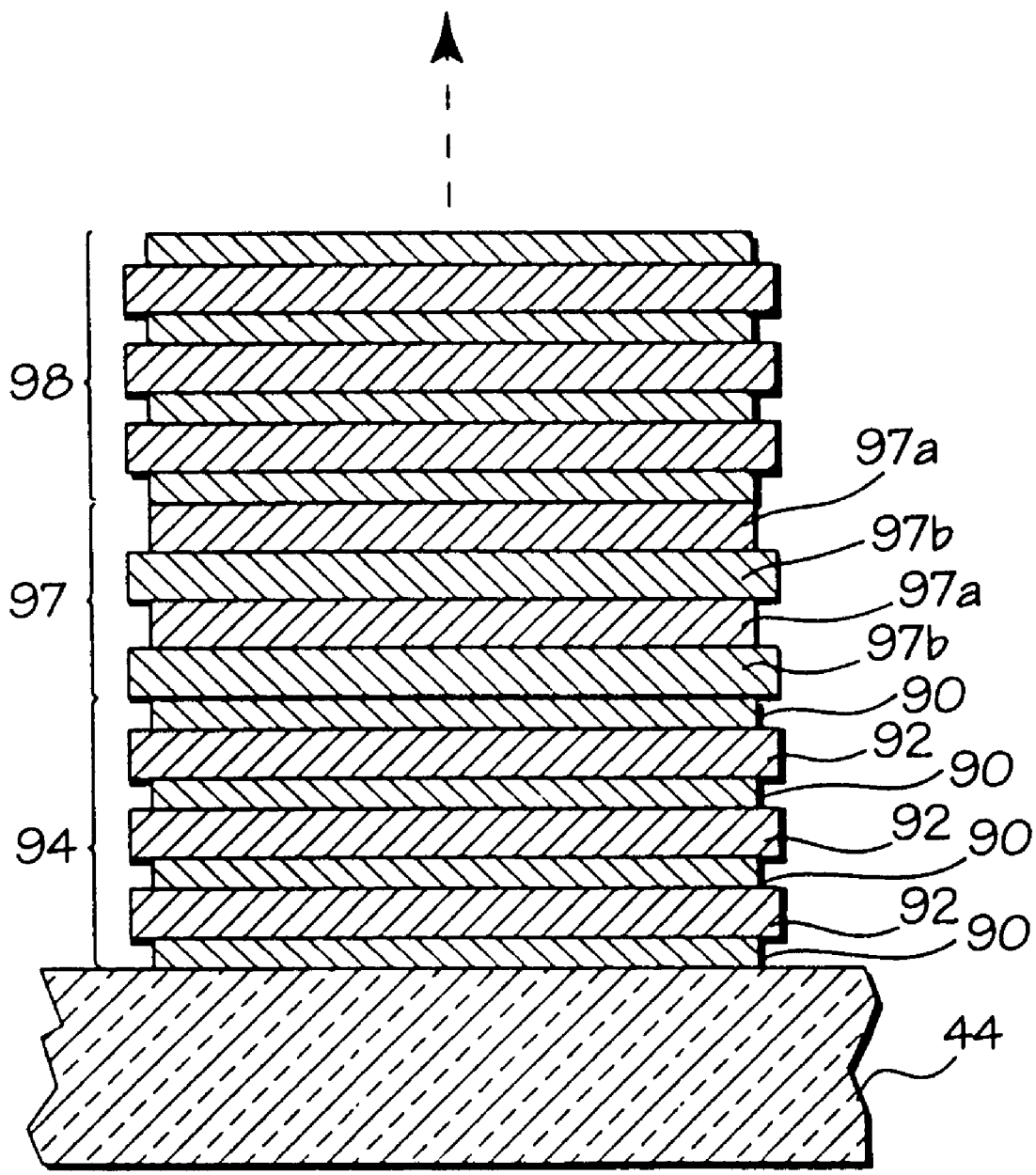

Preferred film stack structures for the multi-cavity interference filter 38 in the preferred embodiments of the FL laser illustrated in FIGS. 1 and 2 are illustrated in FIGS. 3–5. Preferably, the thickness of each alternating layer (for example, of niobium pentoxide and silicon dioxide), as well as the total thickness of the film stack, is precisely controlled, e.g. within 0.01% or 0.2 nm over several square inches of area. In addition, film stacks deposited with very low film absorption and scatter and with packing density near unity have low water-induced filter shifting. Such ultra-narrow, multi-cavity bandpass filters have excellent performance characteristics, including: temperature and environmental stability; narrow bandwidth; high transmittance of the desired optical signal and high reflectance of other wavelengths; steep edges, that is, highly selective transmissivity (particularly in designs employing three cavities or more); and relatively low cost and simple construction. A three-cavity filter is shown in FIG. 3, sandwiched between parts 42 and 44 of a transparent optical substrate. (See FIGS. 1 and 2.) The first cavity assembly 85 is immediately adjacent substrate part 44. A second cavity assembly 86 overlies the first cavity and a third cavity assembly 87 overlies the second cavity assembly and forms a surface-to-surface interface with substrate part 42. In FIG. 4 the structure of the "first cavity" 85 is further illustrated. A sequence of stacked films, preferably about 5 to 15 films of alternating high and low refractive index materials, are deposited to form a first reflector. Preferably, the first film immediately adjacent the substrate surface is a layer of high index material, followed by a layer of low index material, etc. Each of the high index layers 90 is an odd integer of quarter wavelengths optical thickness (QWOT) preferably one or three quarter wavelengths or other odd number of QWOTs. The low refractive index layers 92 which are interleaved with the high refractive index layers 90 are similarly one quarter wavelength optical thickness or other odd number of QWOTs in thickness. There may be, for example, about six sets of high and low refractive index layers forming the bottom-most dielectric reflector 94. Cavity spacer 96, although shown schematically as a single layer, typically comprises one to four alternating films of high and low index materials, wherein each of the films is an even number of QWOTs in thickness, that is, an integral number of half wavelengths optical thickness. The second dielectric reflector 98 preferably is substantially identical to dielectric reflector 94 described above. The second and third cavities are deposited, in turn, immediately upon the first cavity and preferably are substantially identical in form.

One alternative film stack is illustrated in FIG. 6, wherein the upper and lower reflectors 94, 98 are as described above for the embodiment of FIGS. 4 and 5. The cavity spacer 97 is shown to be formed of four films, two high index films 97a alternating with two low index films 97b. Each film is 2 QWOTs thick or one half wavelength. Various other alternative suitable film stack structures are possible, and will be apparent to those skilled in the art in view of this disclosure.

Figure 12:
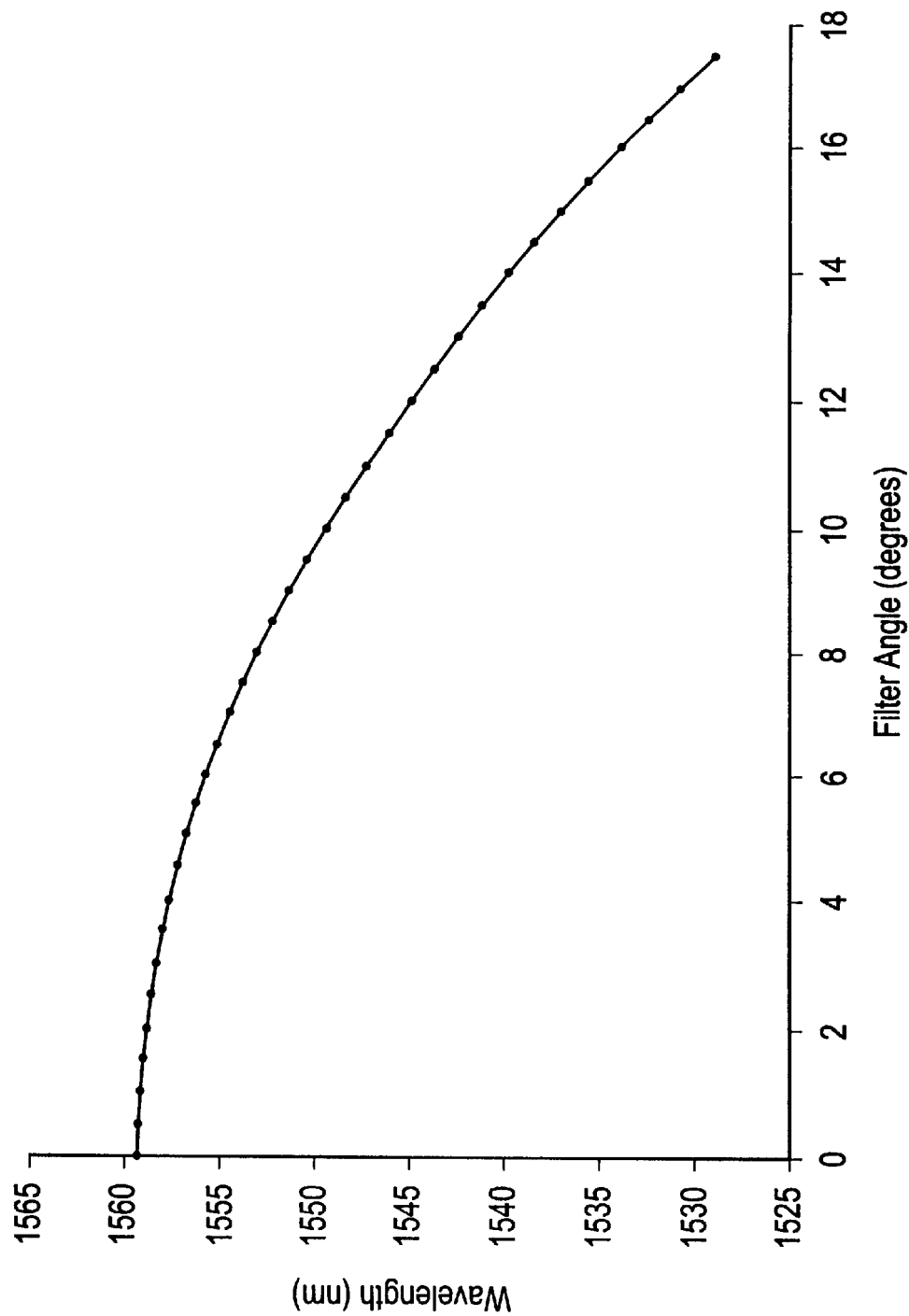
FIG. 12 is a plot showing a range of tuning wavelengths as a function of filter tilt angle typical of a prior art tilt-tunable ECL.
Figure 14:
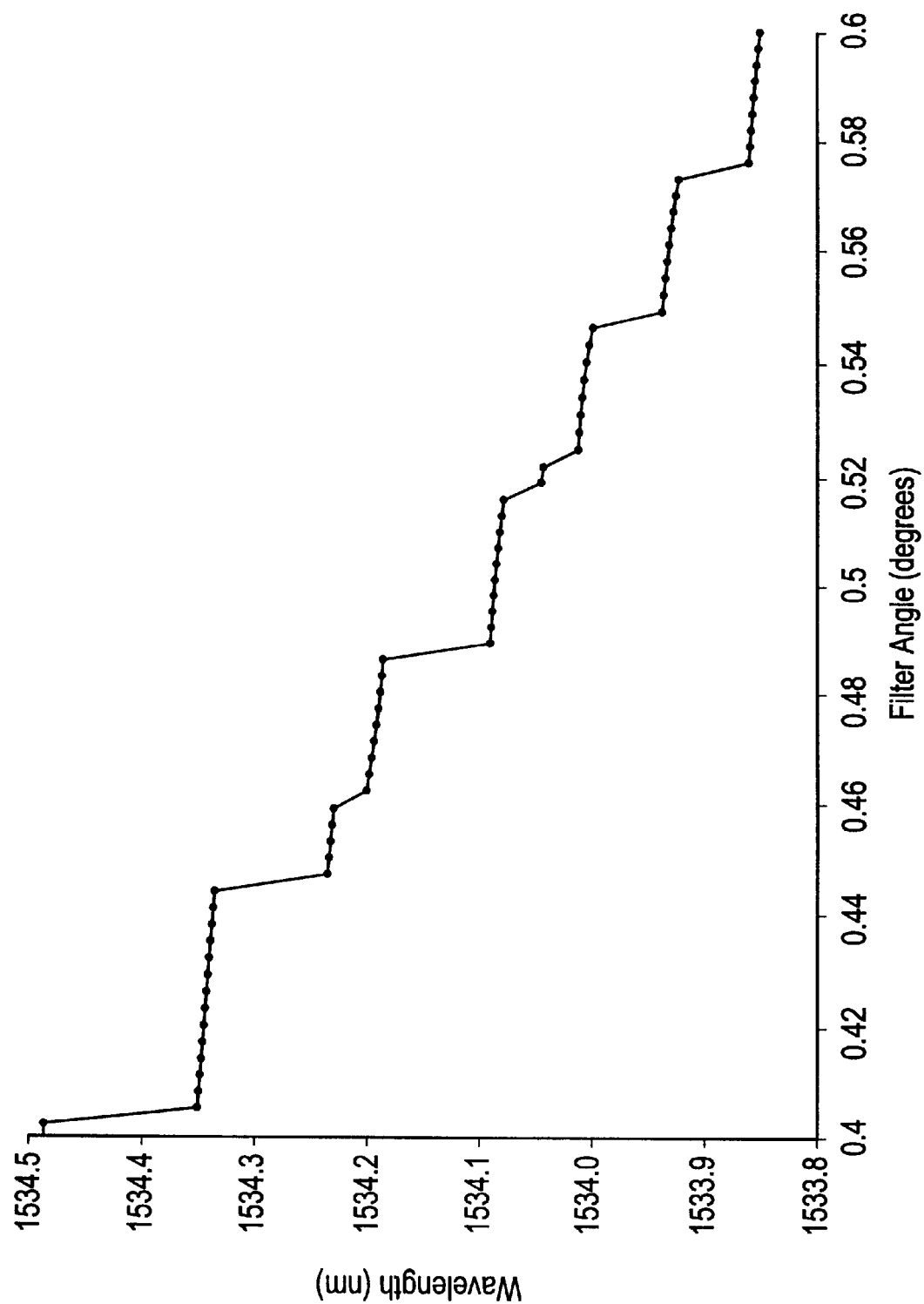
FIG. 14 is a plot illustrating the phenomenon of mode hopping due to tilt-tuning of a prior art tunable ECL.

In accordance with a further preferred aspect, the Fabry-Perot interference filter of the monolithic prism assembly of the optical devices disclosed here may be temperature stabilized or made otherwise tunable through the use of tilt adjustment means when the cavity end reflector is decoupled from the prism assembly. Means can be provided, most preferably associated with the mounting means for the monolithic prism assembly, for altering the tilt angle of the Fabry-Perot interference filter. Typically, the angle of the filter to the collimated light should be increased as temperature increases as peak transmission wavelength shifts to longer wavelength values, and correspondingly decreased as the temperature of the filter drops. In addition, similar techniques can be used to tune the wavelengths by adjusting the tilt angle of the filter. As shown in FIG. 12, the operation wavelength, $\lambda$, of a diode laser tilt-tuned FL laser can be tuned from about 1530 nm to about 1560 nm by tilting the filter between about 0–18 degrees with respect to the optical axis. This common prior art technique, however, does not provide continuous mode-hop-free tuning such as is provided by embodiments of the invention described below; rather, mode jumping occurs between wavelength intervals as illustrated in FIG. 14. This is disadvantageous as will be appreciated, for example, if the wavelengths 1534.4, 1534.3 and other wavelengths falling within the vertically oriented solid lines of the Figure are requires, as the tilt-tuned ECL cannot tune to those wavelengths.

Figure 7:
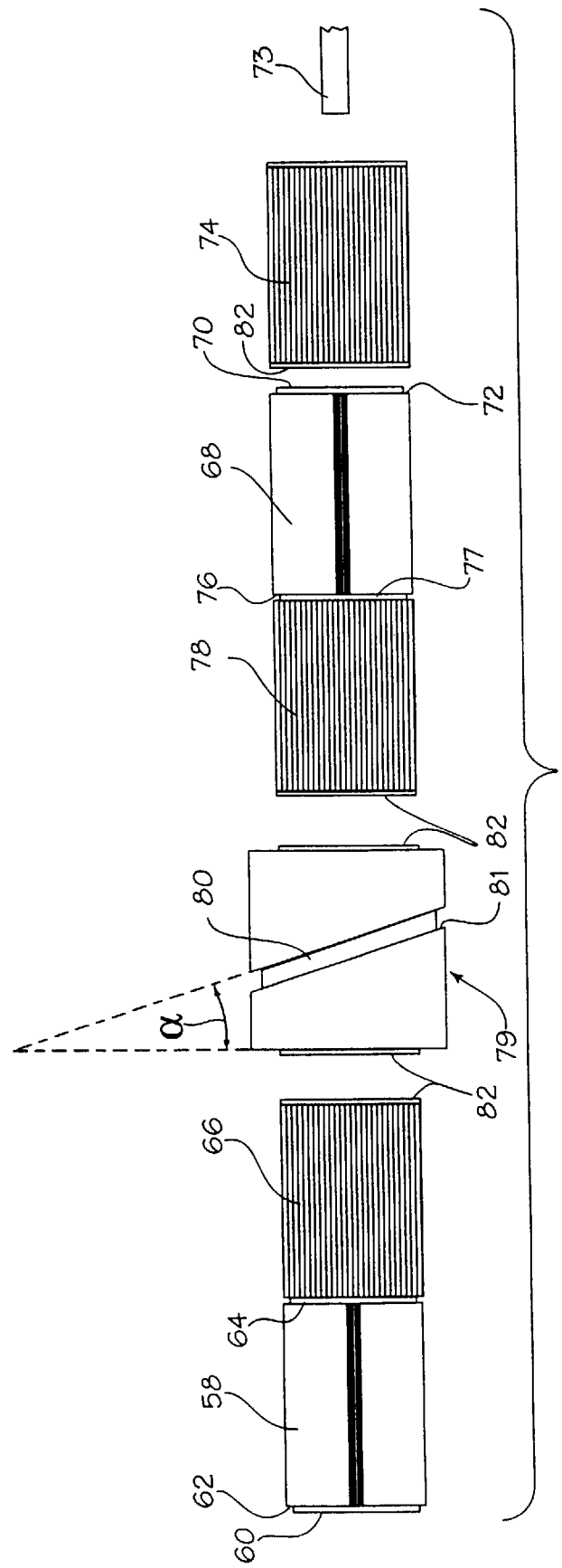
FIG. 7 is a schematic illustration of an optical device comprising an external cavity laser in accordance with another embodiment.

Another preferred embodiment of an FL laser schematically illustrated in FIG. 7 will be understood from the following description to operate in accordance with the principles discussed above. A first diode laser 58 carries a cavity end reflector coating 60 at a first emitter facet 62, and anti-reflection coating 64 at the opposite emitter facet 65 at its interface with collimating means 66. A second diode laser 68 carries optical coupling coating 70 at emitter facet 72, such that a resonant cavity is established between coating 70 and coating 60. Light which passes through optical coupler coating 70 is received by fiber optic pigtail 73 after passing through collimating means 74. Second emitter facet 76 of the second diode laser 68 carries anti-reflection coating 77 through which light is passed to collimating means 78. Positioned between collimating means 78 associated with the second emitter facet 76 of diode laser 68 and the collimating means 66 associated with first diode laser 58 is a monolithic prism assembly 79 carrying a thin film Fabry-Perot narrowband filter 80 on internal face 81. Additional anti-reflection coatings 82 are used at the various surfaces of elements of the optical device. It will be recognized that end reflector 60 could be replaced by an optical output coupling coating such that light could be emitted from the laser device to a fiber optic pigtail, diode sensor of a power feedback loop, etc. Various components of FIG. 7 shown spaced apart can advantageously be butt coupled to reduce the overall size of the device and its optical length.

Figure 8:
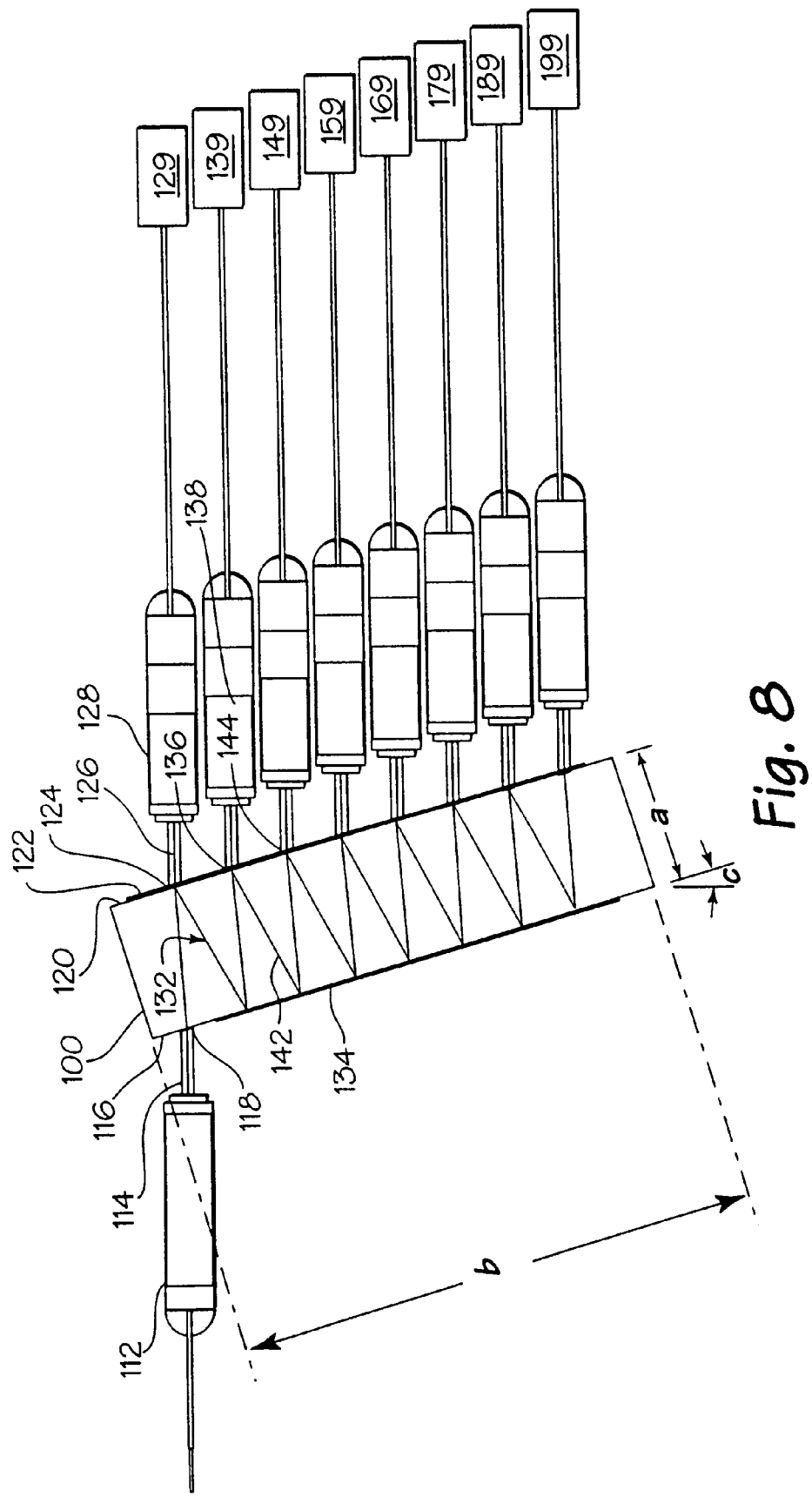
FIG. 8 is a schematic illustration of a dense wavelength division multiplexing device incorporating a number of external cavity lasers in accordance with an embodiment of the present invention.

A dense channel wavelength division multiplexing device is illustrated in FIG. 8, employing an FL laser as disclosed above at each of eight separate ports or channels on an optical block 100. This multiplexing device has the ability to multiplex individual, separate wavelength signals into a common fiber optic carrier line and/or to demultiplex such signals. Typical specifications for an optical multiplexing device in accordance with the preferred embodiment illustrated in FIG. 8 include those provided in Table 2.

TABLE 2

| Number of Channels | 8 |
|---|---|
| Channel wavelength | 1544–1560 |
| Channel spacing | 2 nm ± 0.2 nm |
| Minimum Isolation | 20 dB to 35 dB |
| Insertion loss (total) | less than 6 dB |
| Fiber type | single mode, 1 meter pigtail |
| Operating temperature range | −20° C. to +50° C. |

The optical multiplexing device of FIG. 8 meeting the specifications of Table 2, in addition to optical block 100 which, preferably, is a stable glass substrate, is seen to include means for receiving collimated light, such as a fiber optic gradient index lens collimator 112 or the like, receives highly collimated light 114 from optical port 118 of the optical block at a slight angle through a hole or facet in surface 116 of the optical block. In accordance with one preferred embodiment, the optical block has a thickness "a" of 5 mm, a length "b" of 14.1 mm or more, and a refractive index of about 1.5. The collimated light preferably has a divergence of not more than about 0.15° and the tilt angle "c" at which the collimated light exits the optical block is about 15°. Multi-wavelength light bounces within the optical block between the high reflector coating 134 and opposite surface 120. A channel (or multiple channels) are added (or removed) at each (or every other, etc.) bounce by a reflective filter which transmits a next wavelength increment. Alternative to such series of filters, a graded wavelength, preferably all-dielectric, narrowband bandpass filter 122 is carried on surface 120 of the optical block. Such filter can be made in accordance with the teachings of commonly owned U.S. Pat. No. 5,583,689 entitled "Optical Multiplexing Device," the disclosure of which is entirely incorporated herein by reference. Specifically, filter 122 in such embodiments is a continuous, variable thickness, multi-cavity interference filter, is and, most preferably, is a continuous linearly variable filter. Such filter 122 is transparent at port 124 to a sub-range of the wavelengths included in the collimated light 114. Specifically, light 126 passes through port 124 of the optical block from a collimating lens means 128 associated with a first signal channel. The optical signal passed by port 124 is generated by an external cavity semiconductor diode laser 129 in accordance with any of the preferred embodiments discussed above, meeting stringent spectral performance characteristics in accordance with Table 2, for a first channel of the multiplexing device. The continuous filter 122 at port 124 is reflective of wavelengths which are not "in-band" of the filter at that location. Light 132 is reflected between filter 122 on surface 120 of the optical block and high reflector film or coating 134 on surface 116. High reflector film 134 does not cover optical port 118, so as to avoid interfering with the passage of light 114. Thus, light 132 is reflected by reflector film 134 to strike surface 120 of the optical block at port 124, where it is reflected to pass through port 118. At the location of port 136 next adjacent to port 124, the continuous, variable thickness, multi-cavity interference filter 122 is transparent to a different wavelength or sub-range of wavelengths than it is at port 124. For dense channel wavelength division multiplexing applications, the wavelength separation between each of the multiple ports linearly spaced along surface 120 of the optical block is preferably about 2 nm or less. Thus, at port 136 an optical signal corresponding to a second channel is transmitted through the filter 122 from a collimating lens 138, generated by external cavity semiconductor diode laser 139 in accordance with the preferred embodiments above. As at the first port 124, the interference filter 122 at port 136 is reflects light which is not in-band at that location. Thus, the portion 142 of the light 114 which first entered the optical block prior to this point (i.e., light having wavelengths of others of the channels, originating at laser diode devices 149, 159, 169, 179, 189 or 199) is reflected on toward port 118 from port 136. In similar fashion, the reflected wavelengths at earlier points in the optical block cascade in a zigzag or "multiple-bounce" path in the optical block, with the optical signal for each individual channel being added at successive bounces at surface 120 of the optical block.

Figure 9:
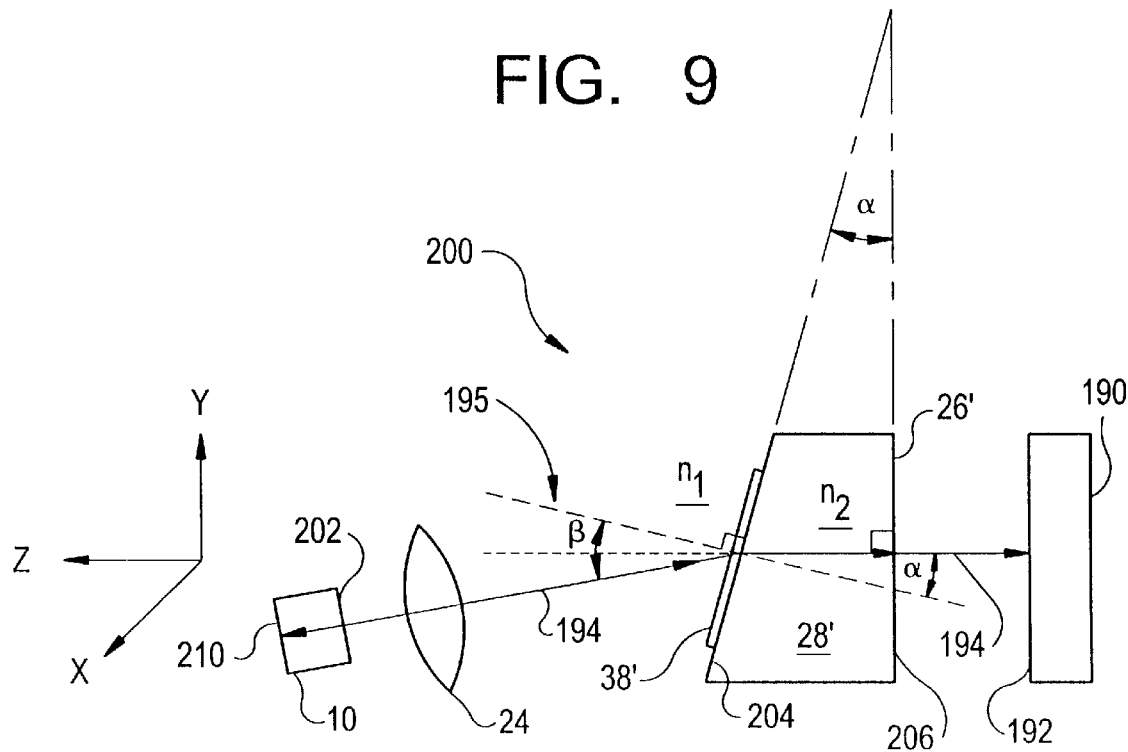
FIG. 9 is a schematic illustration of an external cavity laser in accordance with an alternative preferred embodiment.

FIG. 9 illustrates a compact, single mode, continuously mode-hop-free tunable, filter locked external cavity laser 200 according to another preferred embodiment of the invention. The ECL comprises a gain medium 10, preferably a semiconductor diode laser chip as described herein above, a lens element 24, preferably a GRIN lens, for collimating the laser light emitted from emitter facet 202 of laser 10, a monolithic prism assembly 26' including a thin film Fabry-Perot interference filter 38' incorporated on an external face 204 of transparent optical substrate 28' having an opposing external face 206, and a cavity reflector 190, all of which are optically coupled along optical axis 194. The end facet 210 of diode laser 10 and the front surface 192 of reflector 190 define an external resonant cavity 220 having a physical length $L_o$. The cavity 220 has a total optical length L given by $$L = L_0 + (n_1-1)L_1 + (n_2-1)L_2 + (n_3-1)L_3,$$

where $n_i$ and $L_i$ (I=1–3) are the refractive index and physical length of light travel, respectively, in the laser diode 10, monolithic prism assembly 26', and lens element 24, respectively. The opposing faces 204, 206 of substrate 28' of the monolithic prism assembly 26' are tilted at an angle, α(referred to as the prism wedge angle), preferably less than 1°, with respect to each other. Face 204 incorporates thin film interference filter 38' which is preferably a linear variable filter and more preferably a continuously linear variable filter such as that disclosed in U.S. Pat. No. 5,583, 689. The prism assembly is disposed in the external cavity such that the external face 206 not incorporating filter 38' lies in a transverse plane (X-Y plane of the associated coordinate system). As shown in both FIGS. 9 and 15, the portion of the optical axis 194 of the external cavity outside of, and in the Z-direction to, the monolithic prism assembly 26', does not lie along the Z-axis as in FIGS. 1, 2 and 7; rather it is deviated at an angle, β, measured between optical axis 194 and the normal 195 to the inclined face 204 of the substrate. Substrate face 206 lies substantially in the X-Y plane. One skilled in the art will appreciate that optical axis 194 will be deviated as shown as a consequence of the substrate index of refraction, $n_2$, being different from the index of the cavity, $n_1$ (typically and preferably equal to 1.0), and the inclination of face 204 to the Z-axis. The deviation angle, β, of the optical axis is determined by Snell's Law (i.e., n1 sin β=n2 sin α) once the prism wedge angle, α, is determined as shown by example below. The prism wedge angle, α, and the optical axis tilt angle, β, serve to provide continuous mode-hop-free tuning, and prevent unwanted feedback into the gain medium of out-of-band wavelengths, as discussed more fully below, including an exemplary calculation of these angles. A means (not shown) is provided for translating the monolithic prism assembly 26' in the X-Y plane, i.e., along the X or Y axis corresponding to the direction of the variation of the filter, preferably in the ±Y-direction. The peak transmission wavelength λ of the filter 38' increases linearly from the thinner (top portion as shown) to the thicker side of substrate 28'. As the prism assembly 26' (and thus the filter and substrate) is translated, the operating wavelength changes.

Figure 11:
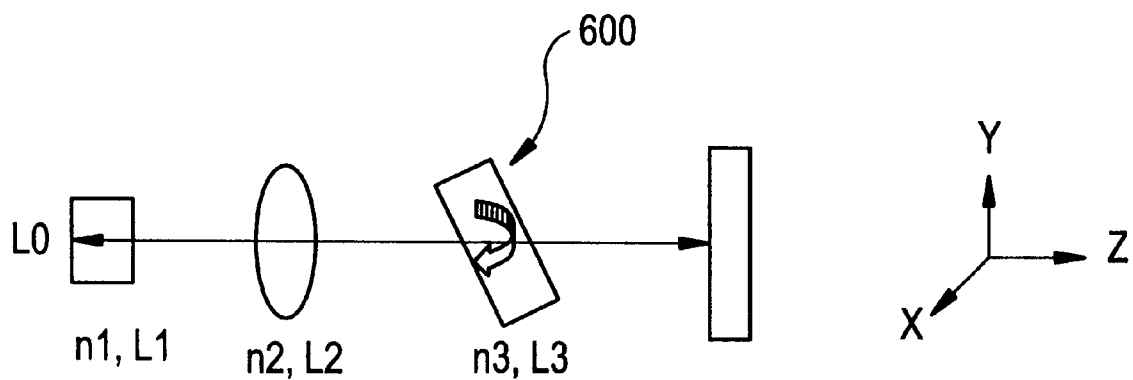
FIG. 11 is a schematic of a tilt-tunable prior art embodiment of an ECL.

It will be further appreciated by those skilled in the art that in a laser cavity, e.g. cavity 220, the condition M=2L/λ must be satisfied for laser operation, where M is an integer, L is the total optical length of the cavity and λ is the operating wavelength. In prior art tunable external cavity lasers such as that illustrated schematically in FIG. 11, a conventional (non-variable) interference filter 600 is tilted or rotated about the X or Y-axis to tune the operating wavelength, since it is known that the peak transmission wavelength of the filter changes with the angle of incidence as shown by example in FIG. 12. However, as filter 600 is rotated, the physical distance $L_3$ that light travels within the filter changes and, as a result, the total optical length L of the laser cavity changes. As is typically the case, the rates of change for L and λ are different, thus the integer M does not remain constant. When M changes, the wavelength λ will have a sudden change or jump by an amount equal to the adjacent mode spacing of the cavity as shown by example in FIG. 14. This is referred to as mode hopping. Mode hopping is disadvantageous to wavelength tuning because it prevents fine wavelength adjustment. The ECL according to an embodiment of the invention illustrated in FIG. 9 provides improvements over prior art tilt-tunable ECL's in that the rate of change in the peak transmission wavelength of the filter as it is translated corresponds to the variable optical path length ($n_3 L_3$) of the substrate 28' so that the value of M stays constant as changes. The invention therefore provides mode-hop-free tuning in an ECL as illustrated by the plot in FIG. 13.

In order to provide continuous mode-hop-free tuning, the condition $$dL/L = d\lambda/\lambda$$

must be satisfied, where L is the total optical cavity length. In an exemplary embodiment of the invention wherein the external cavity has an optical length, L, of 15 mm, filter 38' is a linear variable filter having a Y-dimension of 10 mm and a peak transmission wavelength that varies by Δλ=10 nm (e.g., 1550–1560 nm) over this dimension, and the index, $n_2$, of the monolithic prism substrate is 1.5, $dL = Ld\lambda/\lambda = 96.8 \mu m$. Since $dL = n_2 dL_2$ where $dL_2$ is the change in the physical thickness of the substrate, $dL_2 = 64.5 \mu m$. This results in a prism wedge angle, α, equal to 0.37 degrees. The prism wedge angle is preferably less than 1 degree. As described above, once α is determined, the angle β is directly calculated from Snell's Law, and typically will be about 0.1 degree.

Figure 15:
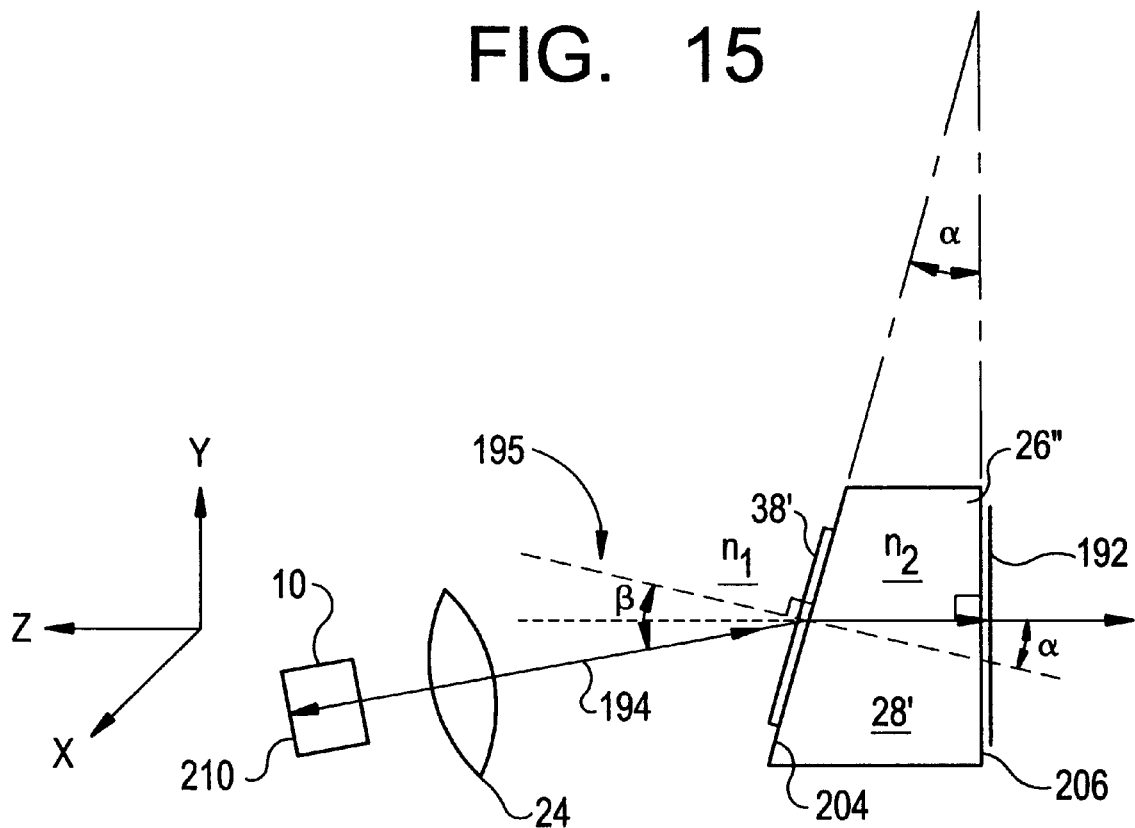
FIG. 15 is a schematic illustration of an external cavity laser in accordance with another preferred embodiment.

In an alternative aspect of this embodiment described with reference to FIG. 15, external face 206 of substrate 28' incorporates reflecting surface 192 which defines one end of the external cavity, the other end defined by surface 210 of the laser diode. Face 206 is disposed in the X-Y plane, and the cavity optical axis outside of the prism assembly is oriented at angle β with respect to prism normal 195 according to Snell's Law as described above, and is preferably on the order of about 0.1 degree.

Figure 10:
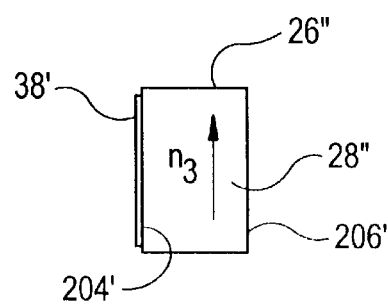
FIG. 10 is a schematic illustration of an alternative monolithic prism assembly in accordance with an embodiment of the invention.
Figure 13:
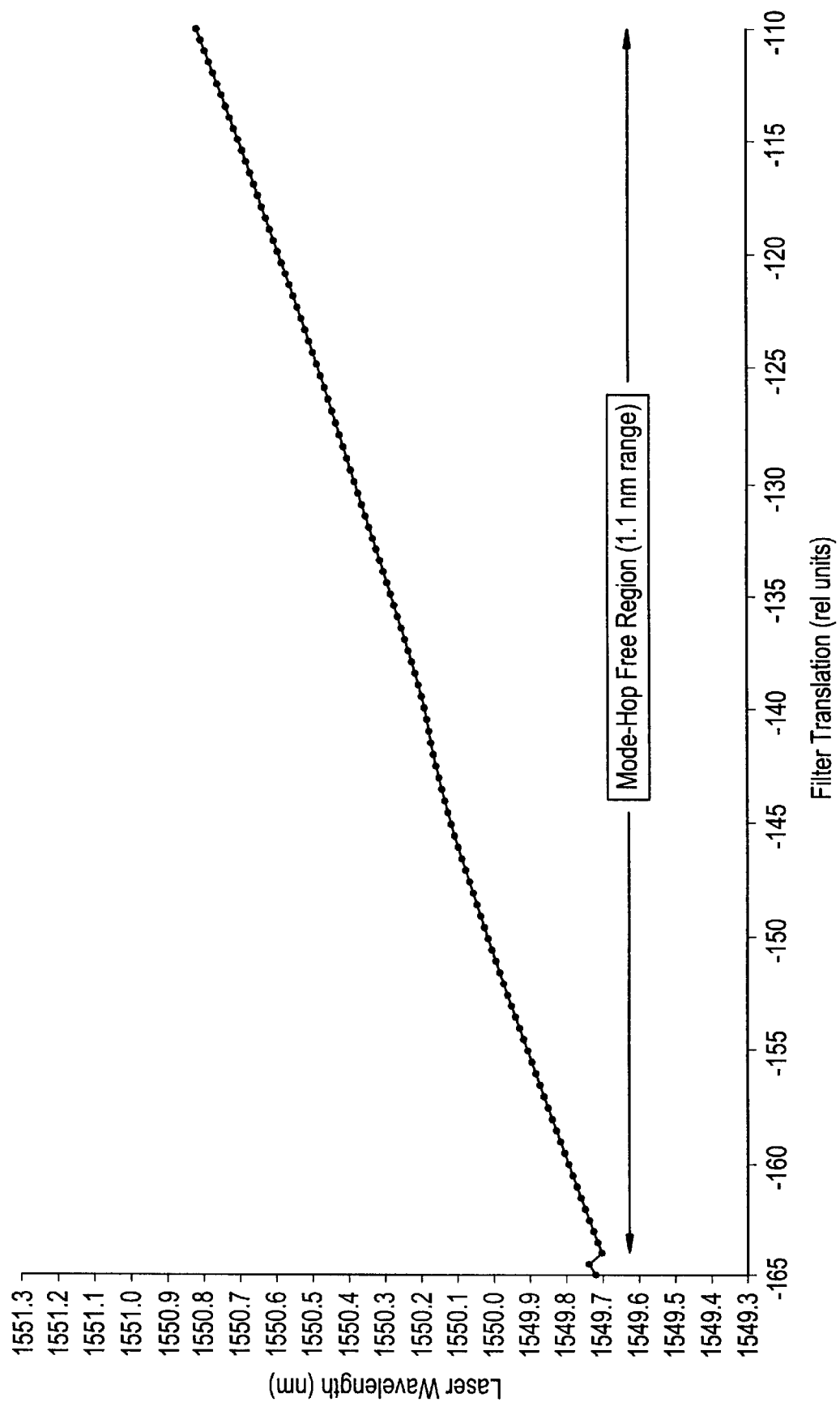
FIG. 13 is a plot showing continuous mode-hop-free tuning by a device according to an embodiment of the invention.

In another preferred embodiment, the monolithic prism assembly 26' of the device 200 in FIG. 9 is replaced by the monolithic prism assembly 26" shown schematically in FIG. 10. Prism assembly 26" comprises optically transparent substrate 28" having opposing external faces 204', 206'; one of which incorporates linear variable filter 39'. Faces 204' and 206' are substantially parallel. The substrate 28" has a gradient index of refraction, $n_3$, that changes linearly in the Y-direction at a rate with respect to $\Delta\lambda$ upon translation such that M stays constant, thus providing mode-hop-free tuning of the ECL operating wavelength. In FIG. 13, continuous mode-hop-free tuning data is shown over a wavelength span exceeding 1 nm from about 1549.7 nm to about 1550.8 nm, with cavity mode spacing of about 0.1 nm.

The monolithic prism assembly of the various embodiments of the invention allows for an external cavity length $\leq 10$ mm, and as short as 3–5 mm. Such a device is compact enough to be packaged in a standard 14 pin package with the device volume $\leq 6$ cm$^3$.

It is a technologically and commercially significant advantage of preferred embodiments of the devices disclosed here, that multiple channels can be so tightly spaced in a narrow wavelength range, with reliable and precise generation of desired wavelengths sub-ranges by reliable and commercially feasible external cavity diode laser devices. With FL lasers, such DWDM multiplexing devices can now be mass produced with suitable wavelength control and consistently reproducible spectral performance characteristics such that fiber-optic DWDM multiplexed systems are rendered commercially feasible.

It will be apparent from the above disclosure of the invention and detailed discussion of certain preferred embodiments that various additions and modifications can be made to the embodiments disclosed without departing from the true scope and spirit of the invention. All such modifications and additions are intended to be covered by the following claims.

What is claimed is:

1. An external cavity laser comprising, in combination, a gain medium optically coupled to an external resonant cavity, and a monolithic prism assembly in the external resonant cavity optically coupled to the gain medium, comprising a transparent substrate incorporating a thin film Fabry-Perot narrowband interference filter manufacture thereof at an acute angle to a transverse plane of the external resonant cavity wherein the laser operates in a single longitudinal mode.

2. The external cavity laser in accordance with claim 1 wherein the acute angle of the thin film Fabry-Perot interference filter of the monolithic prism assembly to a transverse plane of the external resonant cavity is greater than zero degrees and less than 45°.

3. The external cavity laser in accordance with claim 1 wherein the thin film Fabry-Perot interference filter comprises multiple thin film reflector layers sandwiching between them at least one thin film cavity layer.

4. The external cavity laser in accordance with claim 3 wherein each cavity layer is formed of one to four dielectric films of alternating high and low refractive index, each having an optical thickness equal to an integral number of half wavelengths, and the reflector layers each is formed of two to twelve dielectric films of alternating high and low refractive index, each having an optical thickness equal to an odd number of quarter wavelengths.

5. The external cavity laser in accordance with claim 1 wherein the external resonant cavity has a physical length of less than 10 mm.

6. The external cavity laser in accordance with claim 1 wherein the Fabry-Perot interference filter is a multi-cavity filter.

7. The ECL of claim 1 wherein the substrate incorporates a coating on an extended face of the substrate defining an end of the external resonant cavity.

8. An optical device comprising, in combination, a single mode external cavity laser, including an anti-reflection coating on a first emitter facet of a semiconductor diode laser optically coupled to an external resonant cavity having an optical axis, an output coupler coating on a second emitter facet of the diode laser, a monolithic prism assembly in the external resonant cavity comprising a transparent optical substrate carrying a cavity-end reflective coating on one face of the substrate and a thin film Fabry-Perot interference filter on an opposing face of the substrate between the cavity-end reflective coating and the first emitter facet at an acute angle to a plane transverse of the optical axis, the thin film Fabry-Perot interference filter comprising multiple thin film reflectors sandwiching between them at least one thin film cavity layer.

9. The optical device in accordance with claim 8 wherein the cavity-end reflective coating is partially transparent and optically couples the diode laser to an output element.

10. The optical device in accordance with claim 9 wherein the output element is a diode sensor of a power feedback loop.

11. The optical device in accordance with claim 8 wherein the output coupler coating is optically coupled through a second collimating means to a fiber-optic pigtail.

12. An optical device comprising, in combination:
a single mode external cavity laser comprising first and second semiconductor diode lasers at opposite ends of a common external resonant cavity, the first diode laser having a first coating on a first facet defining a first end of the external resonant cavity, and the second diode laser having an output coupler reflective coating on a second facet defining a second end of the external resonant cavity and optically coupling the second diode laser to an output element;
a monolithic prism assembly in the external resonant cavity between the first and second diode lasers, comprising a transparent optical substrate carrying a thin film Fabry-Perot interference filter on a face of the substrate, having at least one thin film cavity sandwiched between thin film reflectors; and
a collimating element between the first and second lasers.

13. The optical device in accordance with claim 12 wherein the monolithic prism assembly has first and second anti-reflection coatings on parallel external surfaces, the thin film Fabry-Perot interference filter being on an internal face of the monolithic prism assembly between the first and second anti-reflection coatings.

14. The optical device in accordance with claim 12 wherein the output element is a second collimating element optically coupled to a fiber-optic pigtail.

15. The optical device in accordance with claim 12 wherein the first coating optically couples the first diode laser to a second output element.

16. A dense wavelength division multiplexing fiber-optic communication system comprising, in combination, a semiconductor diode laser optically coupled to a monolithic prism assembly in an external resonant cavity of overall length less than 10 mm, the monolithic prism assembly comprising a transparent optical substrate carrying on an internal surface a multi-cavity thin film Fabry-Perot interference angled to reflect out-of-band wavelengths away from the diode laser and comprising multiple thin film reflectors sandwiching between them at least one thin film cavity.

17. An external cavity laser, comprising:
an external resonant laser cavity having an optical axis, comprising a cavity end coating at one end of the cavity and another cavity end coating at another end of the cavity;
an optical gain medium optically coupled to disposed in, and the external laser cavity; and
a monolithic prism assembly disposed in, and optically coupled to, the external laser cavity, comprising a transparent substrate having a first external face and a second face opposed to the first face and inclined at an acute angle to the first face and to a transverse plane of the external cavity, wherein the substrate incorporates a thin film Fabry-Perot type interference filter further wherein the laser operates in a single longitudinal mode.

18. The laser of claim 17 wherein the angle of the thin film Fabry-Perot interference filter of the monolithic prism assembly to a transverse plane of the external resonant cavity is greater than zero degrees and less than 45°.

19. The laser of claim 18 wherein the angle is less than 1 degree.

20. The laser of claim 17 wherein the external cavity has a physical length, $L_o < 10$ mm.

21. The laser of claim 17 having a packaged volume $\leq 6$ cm$^3$.

22. The laser of claim 17 wherein the substrate further comprises a second, external face that is substantially parallel to the first external face, one of the first and the second external faces incorporating one of the cavity end coatings, further wherein the second face incorporating the filter is an internal face of the substrate.

23. The laser of claim 17 wherein the gain medium is a semiconductor laser diode having an emitter fact incorporating the other cavity end coating.

24. The laser of claim 17 further comprising a collimating element disposed in the cavity along the optical axis intermediate the monolithic prism assembly and the gain medium.

25. The laser of claim 24 wherein the cavity has a physical length <10 mm.

26. The laser of claim 17 wherein the interference filter has a transmission peak substantially centered on one of a plurality of longitudinal modes of the cavity, and a bandwidth at FWHM that is less than twice the spacing between two adjacent longitudinal modes of the laser cavity.

27. The laser of claim 17 wherein the interference filter has a transmission peak substantially centered on one of a plurality of longitudinal modes of the cavity, and a bandwidth at FWHM that is $\geq$ twice the spacing between two adjacent longitudinal modes, further wherein the filter has a loss difference at FWHM sufficient to prevent oscillation of the longitudinal modes adjacent the center mode.

28. The laser of claim 17 having a gain medium dependent emission spectrum between about 600–2000 nm, further including means for tilt tuning the emission wavelength of the laser.

29. The laser of claim 17 wherein the interference filter has a substantially uniform optical thickness.

30. The laser of claim 17 wherein the filter is a linear variable filter incorporated on the second face of the substrate, further wherein the first external face incorporates one of the cavity end coatings.

31. The laser of claim 30 further comprising means for translating the monolithic prism assembly in an X-Y plane of an X-Y-Z coordinate system, wherein the angle is such that the value of M in the expression $M=2L/\lambda$ is constant as $\lambda$ changes due to the prism assembly and filter translation, where M is an integer, L is the total optical length of the cavity and $\lambda$ is the operational wavelength of the laser.

32. The laser of claim 30 wherein the filter is continuously linearly variable.

33. The laser of claim 30 having a physical external cavity length less than 10 mm.

34. The laser of claim 17 wherein the first external face is disposed in an X-Y plane of an X-Y-Z- coordinate system, further wherein a portion of the optical axis external to the monolithic prism assembly is inclined at an angle with respect to a normal to the second face of the monolithic prism assembly.

35. A single mode external cavity laser, comprising:
an external resonant laser cavity having an optical axis, comprising a cavity end coating at one end of the cavity and another cavity end coating at another end of the cavity;
an optical gain medium disposed in and optically coupled to the external laser cavity;
a monolithic prism assembly disposed in and optically coupled to the external laser cavity comprising a transparent substrate having substantially parallel opposing faces wherein one of the faces incorporates a linearly variable thin film F-P interference filter, further wherein the substrate has a gradient index of refraction; and
means for translating the monolithic prism assembly in X-Y plane of an X-Y-Z coordinate system, wherein M in the expression $M=2L/\lambda$ remains constant as the prism assembly is translated to change $\lambda$, where M is an integer, L is the total optical length of the cavity and $\lambda$ is the operational wavelength of the laser.

36. The laser of claim 35 wherein the opposing face of the substrate incorporate one of the cavity-end coatings.

37. The laser of claim 35 wherein the cavity has a physical length less than 10 mm.

38. In an improved external cavity device including a semiconductor diode laser optically coupled to an external resonant laser cavity, having an optical axis and an optical interference filter in the cavity for locking and/or tuning the operation wavelength, $\lambda$, of the device, the improvement comprising a monolithic prism assembly including a transparent substrate having at least two opposing external faces, one of which incorporates the interference filter; and means for translating the monolithic prism assembly transversely to the optical axis, such that upon translation the operating wavelength changes, further wherein the value of M in the expression $M=2L/\lambda$ remains constant as $\lambda$ changes, where M is an integer and L is the total optical length of the cavity wherein the device operates in a single longitudinal mode.

39. The device of claim 38 wherein the filter is a linear variable filter.

40. The device of claim 38 wherein the opposing substrate external faces are inclined at an angle, $\alpha$, with respect to each other of between 0–1°.

41. The device of claim 38 wherein the opposing substrate external faces are substantially parallel, and the substrate has a gradient index of refraction.

42. An external cavity laser, comprising:
an external resonant laser cavity having a length less than 10 mm;

an optical gain medium disposed in and optically coupled to the external laser cavity;

a monolithic prism assembly disposed in and optically coupled to the external laser cavity, including a transparent substrate, a thin film F-P interference filter incorporated on a face of the substrate and inclined at an angle to another face of the substrate, wherein the filter transmission bandwidth and the cavity length in combination are sufficient to provide single mode operation of the laser.

43. The laser of claim 42 wherein the filter is a linear variable filter providing a varying transmission wavelength as a function of position of the filter, further wherein the angle of the substrate faces and the filter wavelength variation are sufficient to provide continuous mode-hop-free tuning of the laser.

44. The laser of claim 42 wherein the angle is less than 1 degree.

* * * * *